United States Patent
Van Dijsseldonk

(10) Patent No.: US 6,597,434 B2
(45) Date of Patent: Jul. 22, 2003

(54) LITHOGRAPHIC APPARATUS, DEVICE MANUFACTURING METHOD, AND DEVICE MANUFACTURED THEREBY

(75) Inventor: Antonius J. J. Van Dijsseldonk, Hapert (NL)

(73) Assignee: ASML Netherlands B.V., Veldhoven (NL)

(*) Notice: Subject to any disclaimer, the term of this patent is extended or adjusted under 35 U.S.C. 154(b) by 119 days.

(21) Appl. No.: 09/813,135

(22) Filed: Mar. 21, 2001

(65) Prior Publication Data

US 2001/0026358 A1 Oct. 4, 2001

(30) Foreign Application Priority Data

Mar. 24, 2000 (EP) .............................. 00302420

(51) Int. Cl.[7] .................. G03B 27/62; G03B 27/42; G03B 27/68; G03B 27/32
(52) U.S. Cl. .................... 355/75; 355/53; 355/52; 355/77
(58) Field of Search ................. 355/75, 53, 72, 355/77, 52, 55; 250/492.1; 359/290

(56) References Cited

U.S. PATENT DOCUMENTS

| | | |
|---|---|---|
| 4,059,346 A | 11/1977 | Levine et al. |
| 4,091,274 A | 5/1978 | Angelbeck et al. |
| 4,203,654 A | 5/1980 | Ellis |
| 4,492,431 A | 1/1985 | Eitel et al. |
| 4,516,832 A | 5/1985 | Jain et al. |
| 4,619,508 A | 10/1986 | Shibuya et al. |
| 4,660,941 A | 4/1987 | Hattori et al. |
| 4,705,365 A | 11/1987 | Wakita et al. |
| 4,708,420 A | 11/1987 | Liddiard |
| 4,726,671 A | 2/1988 | Ahmad et al. |
| 4,773,748 A | 9/1988 | Shih |
| 4,775,230 A | 10/1988 | Meier |
| 4,917,484 A | 4/1990 | Heinz |
| 4,918,583 A | 4/1990 | Kudo et al. |
| 4,939,630 A | 7/1990 | Kikuchi et al. |
| 4,959,531 A | 9/1990 | Marino |
| 5,008,702 A * | 4/1991 | Tanaka et al. ............ 355/52 |
| 5,151,809 A | 9/1992 | Meier |
| 5,172,261 A | 12/1992 | Kato et al. |
| 5,204,784 A | 4/1993 | Spinhirne |
| 5,237,367 A | 8/1993 | Kudo |
| 5,245,384 A | 9/1993 | Mori |
| 5,296,892 A | 3/1994 | Mori |
| 5,300,971 A | 4/1994 | Kudo |
| 5,320,918 A | 6/1994 | Raab et al. |
| 5,357,825 A | 10/1994 | Costello et al. |
| 5,434,697 A | 7/1995 | Ameer |
| 5,479,289 A | 12/1995 | Fisli |
| 5,482,818 A | 1/1996 | Nelson |
| 5,535,043 A | 7/1996 | La Fiandra et al. |
| 5,684,566 A | 11/1997 | Stanton |
| 5,828,690 A | 10/1998 | Unternahrer et al. |
| 5,896,228 A | 4/1999 | Inoue et al. |
| 5,907,441 A | 5/1999 | Sapy |
| 5,986,795 A | 11/1999 | Chapman et al. |
| 6,188,502 B1 | 2/2001 | Aoki |
| 6,285,488 B1 * | 9/2001 | Sandstrom ............ 250/492.1 |
| 6,398,373 B1 | 6/2002 | Guzman et al. |
| 6,411,426 B1 | 6/2002 | Meehan et al. |

* cited by examiner

Primary Examiner—Russell Adams
Assistant Examiner—Peter B. Kim
(74) Attorney, Agent, or Firm—Pillsbury Winthrop LLP

(57) ABSTRACT

In a lithographic projection apparatus, a reflective-type mask is attached to a compliant membrane on a mask table. The backside of the membrane is in turn attached to a plurality of actuators which are operable to deform the membrane. A mask level sensor can be used to detect the level of the mask and the actuators operate to keep the mask at a constant level. Additionally, the actuators may also serve to keep the mask flat and in the correct planar orientation.

40 Claims, 2 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates to a lithographic projection apparatus comprising:

- a radiation system for supplying a projection beam of radiation;
- a mask table for holding a mask on a mask bearing surface, the mask serving to pattern the projection beam according to a desired pattern;
- a substrate table for holding a substrate; and
- a projection system for projecting the patterned beam onto a target portion of the substrate.

2. Background of the Related Art

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing pattering by a mask on a mask table, a distinction can be made between two different types of machine. In one type of lithographic projection apparatus, each target portion is irradiated by exposing the entire mask pattern onto the target portion at once; such an apparatus is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices are here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, both incorporated herein by reference.

The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.

Conventionally, the mask table has been positioned such that radiation is passed from the illumination system through the mask, the projection system and onto the substrate. Such masks are known as transmissive masks since they selectively allow the radiation from the illumination system to pass through, thereby forming a pattern on the substrate. Such masks must be supported so as to allow the transmission of light therethrough. This has conventionally been achieved by using a vacuum in the table underneath a perimeter zone of the mask so that the atmospheric air pressure clamps the mask to the table.

In a lithographic apparatus the size of features that can be imaged onto the wafer is limited by the wavelength of the projection radiation. To produce integrated circuits with a higher density of devices, and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include laser-produced plasma sources, discharge sources or synchrotron radiation sources.

When EUV radiation is used, the projection system will be a non-telecentric on the object side. Therefore, variations in the height of the mask will cause variations in the horizontal and vertical position of the image on the substrate. Also, it is necessary to use a vacuum in the light propagating path to avoid absorption of the light. Thus, the conventional vacuum clamping will not operate.

It is an object of the present invention to provide a lithographic apparatus comprising a mask table that may be used to accurately hold a mask to achieve correct positioning and improved flatness.

This and other objects are achieved according to the invention in a lithographic projection apparatus comprising:

a radiation system for providing a projection beam of radiation;

a mask table for holding a mask on a mask bearing surface, the mask serving to pattern the projection beam according to a desired pattern;

a substrate table for holding a substrate; and a projection system for projecting the patterned beam onto a target portion of the substrate, characterized in that said mask table comprises:

a compliant membrane comprising the mask bearing surface; and at least one actuator operable to apply a force to the membrane so as to deform the membrane in a direction substantially perpendicular to the mask bearing surface.

Thus, variations in the surface of a reflective mask can be easily and accurately corrected.

Preferably, the actuators are operable on the backside surface, which opposes the mask bearing surface, of the membrane, and a number of such actuators may be used to increase the precision with which the membrane can be deformed. Further, springs may be used between the actuators and membrane so that the forces applied can be tightly controlled.

A mask level sensor may advantageously be used to scan the surface of the mask at a plurality of points so as to construct a three-dimensional map of the mask surface. A controller can then be used to instruct the actuators to provide forces to the membrane such that any irregularities in the mask surface are reduced.

The present invention also provides a lithographic projection apparatus as described above, further comprising a means for attaching a mask to said compliant membrane using an electrostatic force.

According to a further aspect of the invention there is provided a device manufacturing method comprising the steps of:

providing a substrate that is at least partially covered by a layer of radiation-sensitive material;

providing a projection beam of radiation using a radiation system;

using a mask to endow the projection beam with a pattern in its cross-section; and projecting the patterned beam of radiation onto a target portion of the layer of radiation-sensitive material, characterized by deforming a compliant membrane comprising a mask bearing surface against which the mask is supported in a direction substantially perpendicular to the mask bearing surface so as to control a shape of the mask.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle","wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV or XUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings, in which like reference numerals indicate like parts, and in which.

DETAILED DESCRIPTION OF THE INVENTION

Figure 1:
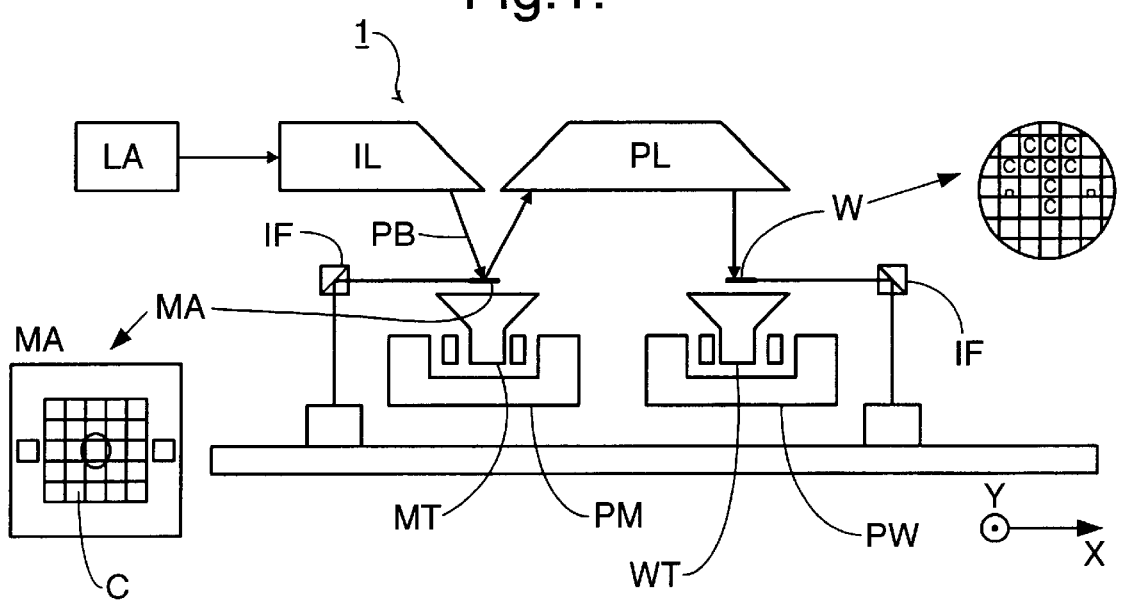
FIG. 1 depicts a lithographic projection apparatus according to an embodiment of the invention.

FIG. 1 schematically depicts a lithographic projection apparatus 1 according to the present invention. The apparatus comprises:

a radiation system LA, IL for supplying a projection beam PB of EUV radiation;

a first object table (mask table) MT for holding a mask MA (e.g. a reticle), and connected to first positioning means PM for accurately positioning the mask with respect to item PL;

a second object table (substrate table) WT for holding a substrate W (e.g. a resist-coated silicon wafer), and connected to second positioning means PW for accurately positioning the substrate with respect to item PL;

a projection system ("lens") PL for imaging an irradiated portion of the mask MA onto a target portion C (die) of the substrate W. As here depicted, the projection system is of a reflective type.

The source LA (e.g. a laser-produced plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus, but that it may also be remote from the lithographic projection apparatus, the radiation beam which it produces being led into the apparatus (e.g. with the aid of suitable directing mirrors). The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library or during a scan. In general, movement of the object tables MT, WT will be realized with the aid of a long-stroke module (course positioning) and a short-stroke module (fine positioning), which are not explicitly depicted in FIG. 1.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

The present invention inter alia alleviates the problem that variations in the height of the mask cause variations in the horizontal position of the final image on the substrate (which will cause overlay errors with respect to previous and/or subsequent layers of a device made).

Figure 2:
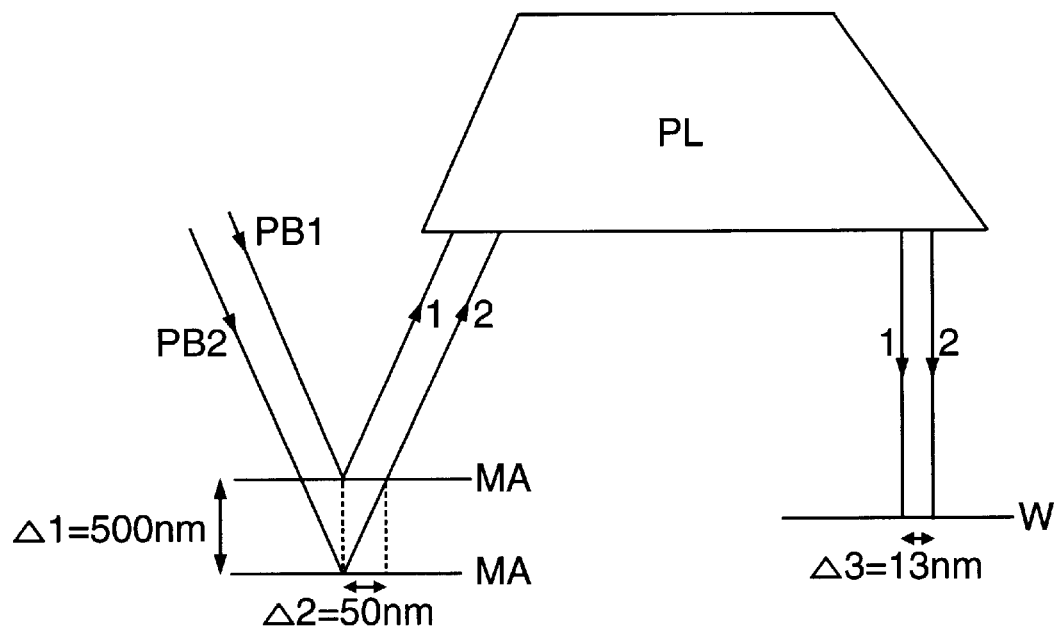
FIG. 2 is a sketch of two possible radiation beam paths showing the effect of varying the mask height.

FIG. 2 of the accompanying drawings illustrates this phenomenon. Illumination beams PB1 and PB2 impinge on the mask at a fixed angle (of 6° with respect to the surface normal in the embodiment shown). However, variations in the height of the mask mean that the resulting reflected beams will enter the entrance pupil of the projection system at a different position. Reflected beam 1 shown in FIG. 2 results when beam PB1 reflects from the mask which is at a first vertical position. If the height position of the mask were to vary (say by $\Delta 1=500$ nm as shown in FIG. 2), the same point on the mask would be struck by beam PB2 and reflected beam 2 would result. The variation in the height of the mask means that the image of the point on the mask at which illumination beams PB1 and PB2 are reflected moves horizontally on the entrance pupil of the projection system (by $\Delta 2=500 \times \tan(6°)=50$ nm in FIG. 2). This horizontal movement is scaled in the projection system by an amount corresponding to the magnification factor of the projection system. Thus in FIG. 2, the horizontal movement on the wafer is seen as $\Delta 3=50 \times 0.25=13$ nm since the magnification factor, in this example, is 0.25. When it is appreciated that many layers must be provided on the wafer with an overlay error of, for example, no more than 3 nm, it can be seen that it is critical to control the height of the mask.

Figure 3:
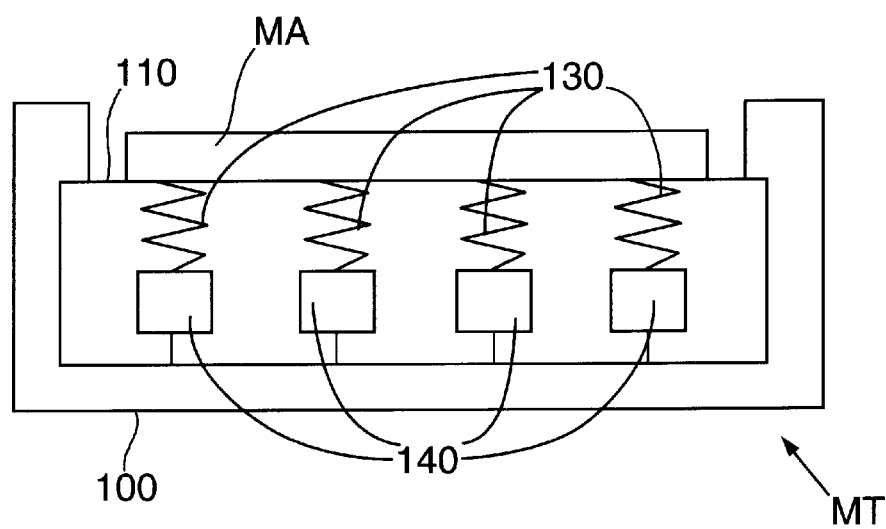
FIG. 3 is a cross-sectional sketch of a mask table according to the present invention.

The mask table is shown in greater detail in FIG. 3. As can be seen, the table itself comprises a box-like enclosure 100 having a U-shaped configuration in cross-section. A flexible membrane 110 is disposed over the opening in the mask table and the mask MA is attached to the outer surface (the mask bearing surface) of the membrane. Since a vacuum force cannot be used, the mask is attached to the membrane using electrostatic forces. In other words, the mask and membrane are oppositely charged to create a mutual attraction. The backside of the membrane is attached to a system of springs 130 and actuators 140, which are in turn attached to the bottom of the box-like enclosure 100. The membrane is able to be deformed due to forces which can be applied by the actuators 140. The actuators may be linear actuators such as pistons or linear motors. Further, piezoelectric actuators are suitable. Passive force actuators, such as adjustable springs, adjustable pneumatic cylinders or adjustable balance masses may be used to exert a force on a part of the membrane without the dissipation of heat. Thus, such passive force actuators may advantageously be used in the mask holder of the present invention. The actuators are controlled by a controller (not shown) so that precise forces may be applied to the membrane to ensure that the mask is at the correct vertical position and has good flatness.

The membrane and spring arrangement has an advantage in that any particle backside contamination of the mask is compensated by the flexibility of the membrane and that it is relatively easy to provide corrective deformation to this construction. In FIG. 3, four sets of actuators and springs are used, but this is not intended to be limiting. A higher or lower number could be used, but in general a large number of actuators are advantageous since this allows the membrane to be deformed more precisely.

Masks are manufactured with a high degree of flatness but, nevertheless, deviation of the mask surface from perfect flatness (referred to as "unflatness") of sufficient magnitude noticeably to affect positioning accuracy can occur. Unflatness may be caused, for example, by variations in mask thickness, distortion of the shape of the mask or contaminants on the mask holder. Unless the context otherwise requires, references below to "the mask surface" refer to the top surface of the mask onto which the radiation impinges.

Not shown in FIG. 3 is a mask level sensor which measures details of the mask level. The level sensor may be, for example, an optical sensor such as that described in U.S. Pat. No. 5,191,200, incorporated herein by reference, the optical sensor being referred to therein as a focus error detection system, or such as described in European patent application EP 1 037 117 (P-0128), incorporated herein by reference. The level sensor may measure the vertical position at a plurality of lateral positions simultaneously and for each may measure the average height of a small area, so averaging out unflatness of high spatial frequencies.

The optical level sensor is able to scan the height of a two-dimensional area by moving a light beam or a group of such beams across the area. The light beams are reflected and the reflected beams are measured to determine the height of the surface at which reflection took place. Only a small area of the surface is mapped at any one time, but since the point of reflection moves as the incident light beam moves, the entire surface can be mapped in a scanning process.

Information from the mask level sensor is used by a controller to determine how to instruct the actuators. For example, when the mask level sensor indicates that part of the mask is too high, the controller would instruct the actuators to move such that that part of the mask is lowered, thereby increasing flatness and improving the average height of the mask. The mask level sensor is one which is capable of taking measurements at a plurality of points on the mask so the controller can cause the actuators to apply forces such that the mask is not only at the correct vertical position, but also has increased flatness. Further, the actuators can correct tilt of the mask, which is important for some applications.

One method according to the present invention is as follows. Firstly, the mask level sensor is used to map the outer surface of the mask so that any irregularities or errors in height can be ascertained. The controller then calculates what forces need to be applied by each of the actuators and controls the actuators accordingly. The actuators may themselves be provided with sensors to detect that they have acted as instructed. In this case, the controller can interrogate the sensors on the actuators to determine whether the actuators have moved by the correct amount. Alternatively, a second scan of the mask surface can be carried out to detect that the adjustment was sufficient in removing irregularities and errors in flatness, tilt and height. This process can be continuous in that the controller constantly checks the surface of the mask with the mask sensor and continuously updates the actuators so that any external variations (for example caused by temperature changes) are continuously monitored and corrected. Alternatively, this process can be carried out just once before exposure of the water.

The invention as described above is described in the context of holding a mask in a lithographic projection apparatus before, during and after a lithographic exposure operation. However, the invention is more generally applicable to any situation in which it is necessary to hold a mask. For example, the mask table (or holder) of the present invention can advantageously be used in a device for making a mask (e-beam writer) because the mask is then perfectly flat during the production of the mask. It is also advantageous to use the mask table of the present invention in a mask (reticle) inspecting device, which is used to inspect the mask for dust, damage or errors.

While we have described above a specific embodiment of the invention it will be appreciated that the invention may be practiced otherwise than as described. The description is not intended to limit the invention.

What is claimed is:

1. A lithographic projection apparatus comprising:
   a radiation system constructed and arranged to provide a projection beam of radiation;
   a mask table constructed and arranged to hold a mask on a mask bearing surface, the mask serving to pattern the projection beam according to a desired pattern;
   a substrate table constructed and arranged to hold a substrate; and
   a projection system constructed and arranged to project the patterned beam onto a target portion of the substrate,
   wherein said mask table comprises:
      a compliant membrane comprising the mask bearing surface; and
      at least one actuator operable to apply a force to at least a part of the membrane so as to deform at least the part of the membrane in a direction substantially perpendicular to the mask bearing surface.

2. An apparatus according to claim 1, wherein the actuator is operable on a backside surface of the membrane, the backside surface opposing the mask bearing surface.

3. An apparatus according to claim 1, wherein the mask table comprises a plurality of actuators, each connected to a different part of the membrane.

4. An apparatus according to claim 1, wherein the mask table further comprises a spring connected to the actuator so as to be operable in series with the actuator on the membrane.

5. An apparatus according to claim 4, wherein the spring is arranged between the actuator and the membrane.

6. An apparatus according to claim 1, further comprising a mask level sensor to measure a position of a surface of the mask held on the mask table in a direction substantially perpendicular to the mask bearing surface.

7. An apparatus according to claim 6, wherein the mask level sensor is constructed and arranged to measure the position at a plurality of different points on the surface of the mask.

8. An apparatus according to claim 6, further comprising a controller operationally connected to the at least one actuator and the mask level sensor, the controller controlling the at least one actuator so as to keep the mask at a predetermined level.

9. An apparatus according to claim 6, further comprising a controller operationally connected to said at least one actuator and the mask level sensor, the controller controlling the at least one actuator so as to increase or preserve the flatness of the surface of the mask.

10. Apparatus according to claim 1, further comprising electrostatic force generator adapted to produce an electrostatic force to attach the mask to the compliant membrane.

11. An apparatus according to claim 1, wherein the mask is a reflective mask.

12. An apparatus according to claim 1, wherein the radiation system is constructed and arranged to supply a projection beam of radiation having a wavelength of less than 50 nm.

13. An apparatus according to claim 1, wherein the radiation system comprises a radiation source.

14. An apparatus according to claim 12, wherein the projection beam of radiation has a wavelength between 5 and 20 nm.

15. A mask table constructed and arranged to hold a mask on a mask bearing surface, comprising:
   a compliant membrane comprising the mask bearing surface; and
   at least one actuator operable to apply a force to at least a part of the membrane so as to deform at least the part of the membrane in a direction substantially perpendicular to the mask bearing surface.

16. A mask table according to claim 15, wherein the actuator is operable on a backside surface of the membrane, the backside surface opposing the mask bearing surface.

17. A mask table according to claim 15, comprising a plurality of actuators, each connected to a different part of the membrane.

18. A mask table according to claim 15, further comprising a spring connected to the actuator so as to be operable in series with the actuator on the membrane.

19. A mask table according to claim 15, further comprising an electrostatic force generator adapted to produce an electrostatic force to attach the mask to the compliant membrane.

20. A mask table according to claim 15, wherein the mask is a reflective mask.

21. A device manufacturing method comprising:
   providing a substrate that is at least partially covered by a layer of radiation-sensitive material;
   providing a projection beam of radiation using a radiation system;
   using a mask to endow the projection beam with a pattern in its cross-section;
   projecting the patterned beam of radiation onto a target portion of the layer of radiation-sensitive material; and
   deforming at least a part of a compliant membrane comprising a mask bearing surface against which the mask is supported in a direction substantially perpendicular to the mask bearing surface.

22. A device manufactured according to the method of claim 21.

23. A method according to claim 21, comprising deforming the compliant membrane through a backside surface of the membrane, the backside surface opposing the mask bearing surface.

24. A method according to claim 21, comprising deforming the compliant membrane using a plurality of actuators, each connected to a different part of the membrane.

25. A method according to claim 21, further comprising attaching the mask to the compliant membrane using an electrostatic force.

26. A method according to claim 21, wherein the mask is a reflective mask.

27. A method according to claim 21, comprising providing a projection beam of radiation having a wavelength of less than 50 nm.

28. A method according to claim 21, further comprising measuring a position of a surface of the mask in a direction substantially perpendicular to the mask bearing surface.

29. A method according to claim 28, further comprising controlling the deforming of the membrane so as to keep the mask at a predetermined level.

30. A method according to claim 28, further comprising controlling the deforming of the membrane so as to increase or preserve the flatness of the surface of the mask.

31. A lithographic projection apparatus comprising:
- a mask table constructed and arranged to hold a mask, the mask serving to pattern a projection beam according to a desired pattern;
- a substrate table constructed and arranged to hold a substrate;
- a projection system constructed and arranged to project the patterned beam onto a target portion of the substrate; and
- at least one actuator operable to apply a force so as to deform a part of the mask, relative to another part of the mask, in a direction substantially perpendicular to a pattern plane of the mask.

32. An apparatus according to claim 31, comprising a compliant membrane supporting the mask and wherein said at least one actuator is operable to apply the force to at least a part of the membrane.

33. An apparatus according to claim 32, further comprising an electrostatic force generator adapted to produce an electrostatic force to attach the mask to the compliant membrane.

34. An apparatus according to claim 31, wherein the actuator is operable on a backside surface of the mask.

35. An apparatus according to claim 31, comprising a plurality of actuators, each operable to apply a force to a different part of the mask.

36. An apparatus according to claim 31, further comprising a spring connected to the actuator so as to be operable in series with the actuator on the mask.

37. An apparatus according to claim 31, wherein the mask is a reflective mask.

38. An apparatus according to claim 31, further comprising a mask level sensor for measuring a position of a surface of the mask held on the mask table in a direction substantially perpendicular to the pattern plane.

39. An apparatus according to claim 38, further comprising a controller operationally connected to the at least one actuator and the mask level sensor, the controller controlling the at least one actuator so as to keep the mask at a predetermined level.

40. An apparatus according to claim 38, further comprising a controller operationally connected to said at least one actuator and the mask level sensor, the controller controlling the at least one actuator so as to increase or preserve the flatness of the surface of the mask.

* * * * *